THERMO-ELECTRIC MODULAR STRUCTURE AND METHOD OF MAKING SAME

Filed Dec. 26, 1961

INVENTORS
NORMAN S. FREEDMAN
CAREL W. HORSTING
WALTER F. LAWRENCE &
JOHN J. CARRONA
BY
Morris L. Rabkin
Attorney 3,814,633

THERMO-ELECTRIC MODULAR STRUCTURE AND METHOD OF MAKING SAME

Norman S. Freedman, Berkeley Heights, Carel W. Horsting, Caldwell, Walter F. Lawrence, Verona, and John J. Carrona, Scotch Plains, N.J., assignors to Radio Corporation of America Filed Dec. 26, 1961, Ser. No. 162,281
Int. Cl. H01v *1/30*
U.S. Cl. 136—205 14 Claims The invention described herein was made in the course of, or under a contract with the U.S. Atomic Energy Commission.

Figures 1, 3, 4:
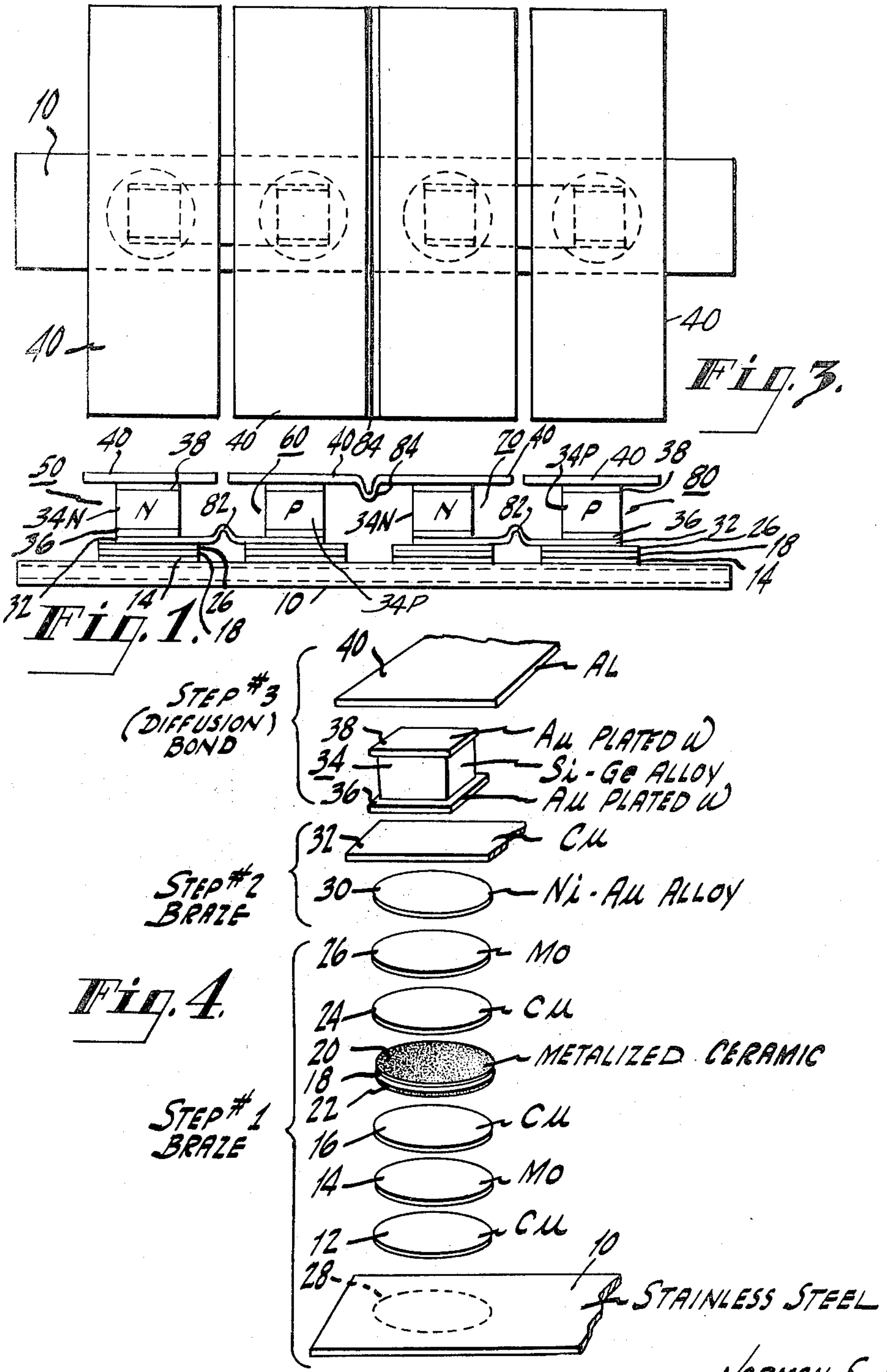

This invention relates generally to thermoelectric energy converters, and more particularly to an improved thermoelectric modular structure. The improved thermoelectric modular structure of the present invention is particularly useful for attachment to a heated surface to convert thermal energy into electrical energy.

It has been proposed to utilize the thermal energy in a metal body to heat the thermoelectric elements of a thermocouple to generate electricity. In order to obtain a maximum transfer of heat between the metal body and the thermoelectric elements, however, it is necessary, in most cases, to place the thermoelectric elements as close to the metal body as possible without actually making electrical contact with it. Where the metal body is a part of a moving vehicle, the thermoelectric elements should be bonded or rigidly fixed to the metal body to withstand vibrations, sudden shocks, and relatively large expansions and contractions of the metal body without breaking off.

Attempts to insulate electrically, but not thermally, the thermoelectric elements of a thermocouple from a metal body have presented difficult problems of construction in the prior art. This is especially true where the bond between the thermoelectric element and the metal body must go through many thermal cycles over a wide range of temperatures, and where the metal body and the insulating material have different coefficients of expansion.

It is an object of the present invention to provide an improved thermoelectric module of the type suitable for attachment to a metal body to convert heat energy from the body efficiently.

It is another object of the present invention to provide an improved thermoelectric module that can withstand a large amount of vibration and mechanical shock when fixed to a metal body in a heat exchange relationship therewith.

It is still another object of the present invention to provide a bonded-stack thermoelectric module having an electrical insulating material that permits heat to pass efficiently therethrough but which resists structural failure under repeated expansions and contractions of metals on both sides of it.

In accordance with the present invention, the improved thermoelectric module comprises a bonded stack of substantially flat components, adjacent ones of which are brazed or diffusion bonded to each other. The stack of components comprises a first equalizer sheet of metal, a wafer of insulating material having metallized surfaces, a second equalizer sheet, preferably of the same metal as the first equalizer sheet, a hot-junction connecting strap of metal, a semiconductor thermoelectric element, and a radiator sheet, in the order named. In the first step of the method of making the module, the first and second equalizer sheets are brazed to opposite large surfaces of the metallized insulating wafer with a high melting point, ductile metal, such as pure copper, at an elevated temperature in vacuo or in a dry, nonoxidizing atmosphere. This construction equalizes strains on both sides of the insulating wafer and prevents it from breaking as a result of repeated expansions and contractions. In the second step of the method, a connecting strap is brazed to the second equalizer sheet with a ductile metal of a lower melting point than that of the connecting strap. In the third step of the method, the connecting strap, the semiconductor thermoelectric element, and the radiator sheet are diffusion bonded together by compressing these parts in a vacuo or in a heated non-oxidizing ambient for a period of time. In the last-mentioned step, the thermoelectric element may have upper and lower shoes, each comprising a gold plated metal, to aid in the diffusion bonding.

Figure 2:
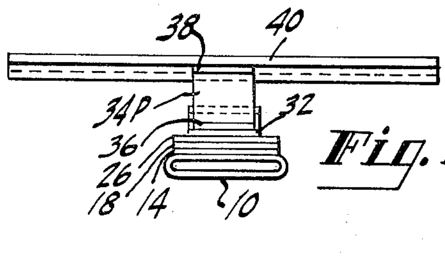

The novel features of the present invention, as well as additional objects and advantages thereof, will be more readily understood from the following description, when read in connection with the accompanying drawing, in which the same reference characters designate similar parts throughout, and in which:

FIGS. 1, 2, and 3 are side elevational, end elevational, and top plan views, respectively, of a thermoelectric energy converter employing improved thermoelectric modular structures of the present invention; and FIG. 4 is an exploded view of an improved thermoelectric modular structure, with parts broken away, showing the components of the modular structure that are involved in the steps of the method of making them.

The construction of the improved thermoelectric modular structure, that is module, of the present invention can be understood best from a description of the method of making it. Referring, first, to FIG. 4, there are shown components of the improved thermoelectric modular structure and a metal body 10 to which the improved thermoelectric modular structure is to be affixed in a heat exchange relationship therewith. The body 10 may be a duct, such as a stainless steel tube, for conducting a heated fluid. Where temperatures in the order of 550° C. are to be used, for example, the body 10 may conduct the flow of molten sodium and potassium. The stainless steel body 10 may be plated with cobalt or nickel to prevent the intergranular penetration of the metals that are brazed or bonded to it.

To affix the improved thermoelectric modular structure to a surface of the body 10, a plurality of components, in the form of sheets or wafers, are placed in a stack and brazed or diffusion bonded to each other. Thus, for example, as a first step in the method of construction, a first braze sheet 12 of a braze material, such as pure copper, a first equalizer sheet 14 of a metal, such as molybdenum, a second braze sheet 16 of the same metal as the first braze sheet 12, a wafer 18 of insulating material, such as a ceramic material (for example, aluminum oxide or beryllium oxide), having upper and lower metallized surfaces 20 and 22, respectively, a third braze sheet 24 of the same metal as that of the first braze sheet 12, and a second equalizer sheet 26, preferably of the same metal as the first equalizer sheet 14, are stacked in a column, in the order named, and over the surface area 28 of the body 10, within the illustrated dashed circle shown in FIG. 4. The stacked sheets 12, 14, 16, the wafer 18, the sheets 24, 26, and the body 10 are placed in a non-oxidizing atmosphere, preferably in a dry hydrogen atmosphere or in vacuo, and heated to a temperature of about 1100° C. The pure copper sheets 12, 16, and 24 melt and braze adjoining metal surfaces to each other. The sheets of the stack may be shaped in the form of discs.

Pure copper is used for the brazing sheets 12, 16, and 24 to withstand relatively large differential stresses resulting from the differences in the thermal expansions between different metals. The equalizer sheets 14 and 26 of molybdenum, as well as the metallized insulating wafer 18, may be plated with iron to improve their braze wettability. The insulating wafer 18 functions as a good electrical insulator, and yet it is a good thermal conductor. It is noted that the edges of the wafer 18 are not metallized so that the wafer can function as an insulator. Thus, the thermoelectric element, to be described hereinafter, can be insulated from the body 10 and still be bonded thereto in a heat transfer relationship.

By brazing similar metals, such as the equalizer sheets 14 and 26 of molybdenum, to both sides of the insulating wafer 18, respectively, upper and lower stresses on the insulating wafer 18 are equalized, and any tendency for the wafer 18 to crack or break under relatively large expansions and contractions is virtually eliminated by this construction. It is also within the contemplation of this invention to use different metals for the equalizer sheets 14 and 26, depending upon the metal to which each equalizer sheet is bonded.

In a second step, a braze sheet 30 having a melting point lower than that of copper, such as a nickel-gold alloy, and a hot-junction connecting strap 32 of copper are placed on the equalizer sheet 26, in the order named. The braze sheet 30 and the connecting strap 32 are heated in vacuo or in a non-oxidizing atmosphere at a temperature below the melting point of copper, but to the temperature necessary to cause the braze sheet 30 to melt. In this step, the connecting strap 32 is brazed to the equalizer sheet 26.

A thermoelectric element 34, such as a semiconductor material of silicon-germanium alloy of either the P-type or the N-type, depending upon its doping, may have bonded or fixed to its lower and upper surfaces, respectively, gold-plated junction shoes 36 and 38 of tungsten. The shoes 36 and 38 may be in the form of square sheets and comprise the hot and cold junction shoes, respectively, of the thermoelectric element 34. The shoes 36 and 38 may be diffusion bonded to the thermoelectric element 34 by the application of pressure and heat in vacuo for a period of time until a strong diffusion bond is formed.

In a third step, the thermoelectric element 34, with its lower and upper gold-plated shoes 36 and 38 attached, is stacked on the connecting strap 32. A radiator sheet 40 of aluminum, that functions as a cold-junction connecting strap, is placed on the upper, gold-plated tungsten shoe 38. The entire assembly is now placed under compression by any suitable compressive loading means and heated in a non-oxidizing atmosphere or in vacuo at about 550° C. for about ½ hour. In this step, the lower shoe 36 is diffusion bonded to the hot-junction connecting strap 32, and the upper shoe 38 is diffusion bonded to the cold-junction strap 40.

In the third step, the outer surfaces of the tungsten shoes 36 and 38 should preferably be nickel plated before they are gold plated to provide good diffusion bonds. Alternatively, instead of gold plating the tungsten shoes 36 and 38, gold foil may be placed between the lower shoe 36 and the connecting strap 32 and between the upper shoe 38 and the radiator sheet 40 to effect good diffusion bonding.

Steps one and two of the aforementioned method of making the thermoelectric modular structure may be combined into a single step if a brazing material is used that has a lower melting point than that of the connecting strap 32. If, for example, nickel-gold alloy sheets are substituted for the copper braze sheets 12, 16, and 24, steps one and two could be combined into a single step.

Referring, now, to FIGS. 1, 2, and 3, there is shown a thermoelectric energy converter, comprising thermoelectric modular structures 50, 60, 70, and 80, for converting heat energy from the surface of the body 10 into electrical energy. The thermoelectric modular structures 50, 60, 70, and 80 are substantially similar to each other, except for the thermoelectric elements 34N of N-type material in the structures 50 and 70 and the thermoelectric elements 34P of P-type material in the modular structures 60 and 80. Adjacent modular structures, having thermoelectric elements of opposite conductivity types, comprise a thermocouple. Since the thermoelectric elements of adjacent modular structures may be arranged in a parallel alignment, as shown in FIG. 1, their hot and cold junctions may be adjacent to each other, respectively. Thus, the hot-junction connecting strap 32 of the modular structure 50 is also used as the hot-junction connecting strap for the modular structure 60. The connecting strap 32 may be kinked, as at 82, between adjacent modular structures in each thermocouple to provide for expansion and contraction of the body 10 at different temperatures. The cold-junction straps, that is, the radiator sheets 40, of adjacent thermocouples are connected to each other to connect the thermocouples electrically in series. Thus, for example, the aluminum radiator sheet 40 of the modular structure 60 is connected to the aluminum radiator sheet 40 of the modular structure 70. The radiator sheet 40 connecting adjacent thermocouples may be kinked, as at 84, to provide for expansions and contractions caused by differences in temperature.

An electrical output of the thermoelectric heat energy converter shown in FIGS. 1, 2, and 3 can be derived between the radiator sheet 40 of the modular structure 50 and the radiator sheet 40 of the modular structure 80. It is noted that a thermoelectric energy converter module comprising a plurality of thermoelectric modular structures, as shown in FIG. 1, for example, may be constructed as a unit by constructing each of the separate thermoelectric modules simultaneously on the metal body 10.

From the foregoing description, it will be apparent that there has been provided an improved thermoelectric modular structure. While embodiments of the present invention have been shown in diagrammatic form, variations in the modular structure, all coming within the spirit of this invention, will, no doubt, readily suggest themselves to those skilled in the art. Hence, it is desired that the foregoing shall be considered merely as illustrative and not in a limiting sense.

What is claimed is:

1. A thermoelectric module adapted to be fixed to a heated body, said module comprising (a) a first equalizer sheet of metal, (b) an electrical insulating wafer having opposite metallized sides, one of said metallized sides being brazed to one of the sides of said first equalizer sheet, (c) a second equalizer sheet of metal having substantially the same coefficient of expansion as said first equalizer sheet and having one side brazed to the other of said metallized sides of said wafer, (d) a hot-junction connecting member having one side brazed to the other side of said second equalizer sheet, (e) a thermoelectric element having hot and cold junction shoes, (f) means bonding said hot junction shoe of said thermoelectric element to the other side of said hot-junction connecting member, (g) a cold-junction connecting member, and (h) means bonding one side of said cold-junction connecting member to said cold junction shoe of said thermoelectric element.

2. A thermoelectric module adapted to be fixed to a source of heat, said module comprising (a) a first equalizer sheet of metal,
(b) an electrical insulating wafer having opposite metallized sides, one of said metallized sides being brazed to one of the sides of said first equalizer sheet,
(c) a second equalizer sheet of metal having substantially the same coefficient of expansion as said first equalizer sheet and having one side brazed to the other of said metallized sides of said wafer,
(d) a hot-junction connecting member having one side brazed to the other side of said second equalizer sheet,
(e) a first metal shoe having two opposite surfaces, one of said surfaces of said first shoe being bonded to the other side of said hot-junction connecting member,
(f) a thermoelectric element having two opposite surfaces one of said surfaces of said thermoelectric element being bonded to the other of said surfaces of said first shoe,
(g) a second metal shoe having two opposite surfaces, one of said surfaces of said second shoe being bonded to the other of said surfaces of said thermoelectric element, and
(h) a cold-junction member having one side bonded to the other of said surfaces of said second metal shoe.

3. A thermoelectric module comprising (a) a first equalizer sheet of molybdenum,
(b) a ceramic wafer having opposite, metallized surfaces, one of said metallized surfaces being brazed to one side of said first equalizer sheet,
(c) a second equalizer sheet of molybdenum having one side brazed to the other of said metallized surfaces of said ceramic wafer,
(d) a hot-junction connecting strap of copper having one side brazed to the other side of said second equalizer sheet,
(e) a thermoelectric element having hot and cold junction shoes,
(f) means bonding said hot junction shoe of said thermoelectric element to the other side of said hot-junction connecting strap,
(g) a cold-junction connecting strap, and
(h) means bonding said cold-junction connecting strap to said cold junction shoe of said thermoelectric element.

4. A thermoelectric module comprising (a) a first equalizer sheet of molybdenum,
(b) a ceramic wafer having opposite, metallized surfaces, one of said metallized surfaces being brazed to one side of said first equalizer sheet,
(c) a second equalizer sheet of molybdenum having one side brazed to the other of said metallized surfaces of said ceramic wafer,
(d) a connecting strap of copper having one side brazed to the other side of said second equalizer sheet,
(e) a first tungsten sheet having one side diffusion bonded to the other side of said connecting strap,
(f) a thermoelectric element having two opposite surfaces, one of said surfaces of said thermoelectric element being diffusion bonded to the other side of said first tungsten sheet,
(g) a second tungsten sheet having one side diffusion bonded to the other of said surfaces of said thermoelectric element, and
(h) an aluminum radiator sheet having one surface diffusion bonded to the other side of said second tungsten sheet.

5. A thermoelectric module comprising, in combination, (a) a metal adapted to receive heat,
(b) a first equalizer sheet of molybdenum having one side brazed to said metal,
(c) a ceramic wafer having opposite, metallized surfaces, one of said metallized surfaces being brazed to the other side of said first equalizer sheet,
(d) a second equalizer sheet of molybdenum having one side brazed to the other of said metallized surfaces of said ceramic wafer,
(e) a hot-junction connecting strap of copper having one side brazed to the other side of said second equalizer sheet,
(f) a thermoelectric element having hot and cold junction shoes,
(g) means bonding said hot junction shoe of said thermoelectric element to the other side of said hot-junction connecting strap,
(h) a cold-junction connecting strap, and
(i) means bonding said cold-junction connecting strap to said cold junction shoe of said thermoelectric element.

6. A bonded-stack thermoelectric module comprising:

(a) an electrical insulating and heat conducting ceramic wafer having opposite major surfaces;
(b) an equalizer layer of metal bonded to each of said surfaces, said equalizer layers having substantially the same coefficient of thermal expansion;
(c) a thermoelectric element having hot and cold junction shoes bonded to the opposite ends thereof; and
(d) metallic means bonding one of said shoes to one of said equalizer layers.

7. A thermoelectric module as in claim 6, wherein each of said equalizer layers has a coefficient of thermal expansion close to that of said ceramic wafer.

8. A thermoelectric module as in claim 6, wherein said equalizer layers are sheets of the same metal.

9. A thermoelectric module as in claim 6, wherein said layers are of molybdenum.

10. A thermoelectric module as in claim 6, wherein said metallic means comprises a module connector strap of high conductivity metal.

11. A thermoelectric module as in claim 10, further comprising a second module connector strap bonded to the other of said shoes.

12. A bonded-stack thermoelectric module comprising:

(a) an electrical insulating and heat conducting ceramic wafer having opposite major surfaces;
(b) an equalizer sheet of molybdenum bonded to each of said surfaces;
(c) a thermoelectric element of silicon-germanium alloy having hot and cold junction shoes of tungsten bonded to the opposite ends thereof;
(d) a hot strap of copper bonded on one side to one of said equalizer sheets and on the other side to said hot shoe;
(e) a cold strap of aluminum bonded to said cold shoe;
(f) means for heating said hot strap; and
(g) means for cooling said cold strap.

13. A bonded-stack thermoelectric module comprising:

(a) an elongated metal heat transfer member;
(b) two spaced P and N type thermoelectric elements each having hot and cold shoes bonded to the opposite ends thereof; and
(c) means bonding each of said elements to said member in thermally coupled and electrically insulated relation, comprising:
  (1) an electrical insulating and heat conducting ceramic wafer having opposite major surfaces;
  (2) an equalizer layer of metal bonded to each of said surfaces, said layers having substantially the same coefficient of thermal expansion;

(3) metallic means bonding one of said layers to said member; and (4) metallic means bonding the other of said layers to the hot shoe of one of said thermoelectric elements.

14. A bonded-stack thermoelectric module as in claim 13, further comprising a metal cold junction strap bonded to and electrically connecting said hot shoes of said elements.

References Cited

UNITED STATES PATENTS

| | | | |
|---|---|---|---|
| 3,053,923 | 9/1962 | Stearns | 136—4 |
| 3,057,939 | 10/1962 | Fritts | 136—4 |
| 3,057,940 | 10/1962 | Fritts | 136—4 |
| 2,754,238 | 7/1956 | Arenberg | 29—25.35 X |
| 3,070,644 | 12/1962 | Van DerGrinten et al. | 136—4 |
| 3,083,248 | 3/1963 | Schumacher | 136—4 |
| 3,069,752 | 12/1962 | Sherning | 29—155.5 |
| 3,126,616 | 3/1964 | Pietsch | 29—155.5 |

BENJAMIN R. PADGETT, Primary Examiner

U.S. Cl. X.R.

136—211, 239, 224